United States Patent
Tu et al.

(10) Patent No.: US 8,847,146 B2
(45) Date of Patent: Sep. 30, 2014

(54) IMAGE SENSOR PACKAGE STRUCTURE WITH CASING INCLUDING A VENT WITHOUT SEALING AND IN COMMUNICATION WITH PACKAGE MATERIAL

(75) Inventors: Hsiu-Wen Tu, Chu-Pei (TW);
Ren-Long Kuo, Chu-Pei (TW);
Young-Houng Shiao, Chu-Pei (TW);
Tsao-Pin Chen, Chu-Pei (TW);
Mon-Nan Ho, Chu-Pei (TW);
Chih-Cheng Hsu, Chu-Pei (TW);
Chin-Fu Lin, Chu-Pei (TW);
Chung-Hsien Hsin, Chu-Pei (TW)

(73) Assignee: Kingpak Technology Inc., Hsin-Chu Hsien (TW)

( * ) Notice: Subject to any disclaimer, the term of this patent is extended or adjusted under 35 U.S.C. 154(b) by 668 days.

(21) Appl. No.: 12/579,493

(22) Filed: Oct. 15, 2009

(65) Prior Publication Data
US 2011/0024610 A1 Feb. 3, 2011

Related U.S. Application Data

(60) Provisional application No. 61/229,364, filed on Jul. 29, 2009.

(51) Int. Cl.
*H01J 5/02* (2006.01)
*H01L 31/0203* (2014.01)
*H01L 27/146* (2006.01)
*H01L 23/10* (2006.01)
*H01L 23/04* (2006.01)

(52) U.S. Cl.
CPC .......... *H01L 27/14618* (2013.01); *H01L 23/10* (2013.01); *H01L 23/04* (2013.01)
USPC .......................................... 250/239; 257/433

(58) Field of Classification Search
CPC ............ H01L 31/0203; H01L 31/0232; H01L 27/14618; H01L 27/14625; H01L 23/10; H01L 23/04
USPC ....... 250/208.1, 239, 216; 257/434, E31.117, 257/680, 432, 433, 431, 435
See application file for complete search history.

(56) References Cited

U.S. PATENT DOCUMENTS 5,585,671 A * 12/1996 Nagesh et al. ................. 257/697
5,825,623 A * 10/1998 Lee et al. ...................... 361/707

(Continued)

FOREIGN PATENT DOCUMENTS

JP         62262445 A  * 11/1987  .............. H01L 23/02

*Primary Examiner* — Que T Le
*Assistant Examiner* — Jennifer Bennett
(74) *Attorney, Agent, or Firm* — Juan Carlos A. Marquez; Bacon & Thomas PLLC

(57) ABSTRACT

The present invention discloses an image sensor package structure. The image sensor package structure includes a substrate, a chip, a transparent lid, a first casing and a package material. The transparent lid covers a sensitization area of the chip and it also adheres to the chip which is deposed on the substrate. The first casing, which adheres to the transparent lid, forms an opening so that light can pass through the opening and the transparent lid to enter into the sensitization area. The package material covers around the chip and the transparent lid and fills between the substrate and the first casing. Because of the arrangement of adhesive layers placed between the first casing and the transparent lid and between the transparent lid and the chip, the blockage area from moisture is elongated. Therefore, the reliability of the image sensor package structure can be enhanced.

7 Claims, 5 Drawing Sheets

(56) References Cited

U.S. PATENT DOCUMENTS

| | | | |
|---|---|---|---|
| 7,095,123 B2 * | 8/2006 | Prior | 257/787 |
| 7,151,251 B2 * | 12/2006 | Kim et al. | 250/239 |
| 7,227,236 B1 * | 6/2007 | Lee et al. | 257/433 |
| 7,540,672 B2 * | 6/2009 | Webster et al. | 396/529 |
| 7,576,401 B1 * | 8/2009 | de Guzman et al. | 257/432 |
| 2002/0131782 A1 * | 9/2002 | Yamaguchi et al. | 396/429 |
| 2004/0065952 A1 * | 4/2004 | Prior | 257/724 |
| 2006/0243896 A1 * | 11/2006 | Chen | 250/239 |
| 2009/0045476 A1 * | 2/2009 | Peng et al. | 257/432 |

* cited by examiner

IMAGE SENSOR PACKAGE STRUCTURE WITH CASING INCLUDING A VENT WITHOUT SEALING AND IN COMMUNICATION WITH PACKAGE MATERIAL

BACKGROUND OF THE INVENTION

1. Technical Field

The present invention relates to semiconductor packaging structures. More particularly, the present invention relates to an image sensor package structure with improved structural reliability.

2. Description of Related Art

With the rapid progress of technologies, popularization of multimedia devices is accelerated. In addition, when a large number of digital imaging apparatuses, such as digital still cameras, digital video cameras, and digital scanners, have been introduced to the market in recent years, image digitization has become an inevitable trend. One of the crucial elements that makes the digital imaging apparatuses work is the image sensor. It serves to receive and convert optical signals or image signals into electric signals, and transmit the electric signals to a circuit board for analysis, enabling a digital imaging apparatus to photograph.

In order to meet the market demand for digital imaging apparatuses to be as compact as possible, the used image sensor nowadays is typically a CCD (Charge Coupled Device), a CMOS (Complementary Metal Oxide Semiconductor) image sensor, or the like. Therefore, the possibility of downsizing digital imaging apparatuses relies on the technology in packaging the image sensors into minimized image sensor package structures.

Such packaging technology is preferably applicable to mass productions with lower material costs. In addition, the packaging technology should provide appropriate protection to the sensitization area on an image sensor that is extremely sensitive and might be adversely affected by external dust and moisture so as to improve the imaging performance of the image sensor and enhance the reliability of the resultant package structure. Moreover, the service life is maximized and the quality of the digital imaging apparatus is ensured.

However, the liquid compound conventionally used by the traditional packaging technology to package image sensors for preventing moisture invasion is very expensive and leaves the overall material costs of the existing image sensor package structure high. Moreover, the constantly changing processing temperature during baking tends to cause the volatile gases in the liquid compound to burst or create crevices in the baked compound. As a result, the image sensor is likely to be invaded by moisture. When the image sensor package structure later receives a reliability test, the moisture will expand and increase the pressure inside the image sensor package structure, thus resulting in damage to the image sensor and significantly reducing the production yield and reliability of the image sensor package structure.

SUMMARY OF THE INVENTION

The present invention provides an image sensor package structure wherein a transparent lid is peripherally covered by adhesive layers or a casing, so the blockage area from moisture is elongated, thereby preventing the image sensor package structure from external moisture invasion and improving the reliability of the image sensor package structure.

The present invention provides an image sensor package structure wherein a casing is provided with at least one gas vent that allows volatile gases contained in the liquid compound to escape during compound dispensing or post mold cure, thereby improving the production yield of the image sensor package structure.

The present invention provides an image sensor package structure wherein a casing serves to support the image sensor package structure, so the amount of expensive liquid compound used can be decreased, reducing material costs.

The present invention provides an image sensor package structure wherein the casing and adhesive layers are stacked so as to enlarge the air cavity between a transparent lid and a chip in volume, thereby improving the imaging quality.

To achieve the aforementioned effects, the image sensor package structure includes a substrate provided with a plurality of first conductive contacts; a chip including a first surface and a second surface opposite to the first surface, wherein the first surface is bound to the substrate while the second surface has a sensitization area and a plurality of second conductive contacts that surrounds the periphery of the sensitization area and is electrically connected with the first conductive contacts; a transparent lid having a third surface and a fourth surface opposite to the third surface, wherein the third surface adheres to the second surface for covering over the sensitization area to define an air cavity over the sensitization area; a first casing having a first board that is centrally formed with an opening and adheres to the fourth surface; and a package material covering around the chip, the transparent lid, and the first casing at peripheries thereof.

To achieve the aforementioned effects, the image sensor package structure alternatively includes a substrate provided with a plurality of first conductive contacts; a chip including a first surface and a second surface opposite to the first surface, wherein the first surface is bound to the substrate while the second surface has a sensitization area and a plurality of second conductive contacts that surrounds the periphery of the sensitization area and is electrically connected with the first conductive contacts; a transparent lid having a third surface and a fourth surface opposite to the third surface, wherein the third surface covers over the sensitization area to define an air cavity over the sensitization area; a second casing having a second board that is adhesively sandwiched between the second surface and the third surface, a third board that has one edge connected with one edge of the second board, and a fourth board that is parallel to the second board and connected with an opposite edge of the third board; and a package material covering around the chip and the second casing at peripheries thereof.

To achieve the aforementioned effects, the image sensor package structure alternatively includes a substrate provided with a plurality of first conductive contacts; a chip including a first surface and a second surface opposite to the first surface, wherein the first surface is bound to the substrate while the second surface has a sensitization area and a plurality of second conductive contacts that surrounds the periphery of the sensitization area and is electrically connected with the first conductive contacts; a transparent lid having a third surface and a fourth surface opposite to the third surface, wherein the third surface covers over the sensitization area to define an air cavity over the sensitization area; a third casing having a fifth board that adheres to the second surface, a sixth board that has one edge connected with one edge of the fifth board, a seventh board that is parallel to the fifth board and connected with an opposite edge of the sixth board so that the fifth, sixth, and seventh boards jointly form a transverse U-shaped structure for locking in the transparent lid, and an eighth board that extends from the seventh board outward from the third casing; and a package material covering around the chip and the third casing at peripheries thereof.

By implementing the present invention, at least the following progressive effects can be achieved:

1. By virtue of the adhesive layers or the casing covering around the transparent lid, the blockage area from moisture is elongated so that the image sensor package structure is prevented from external moisture invasion.

2. Since the casing serves to support the image sensor package structure, the amount of the expensive liquid compound used can be reduced, leading to reduced material costs.

3. The stacked casing and adhesive layers help to enlarge the air cavity between the transparent lid and the chip in volume, thereby improving imaging quality.

BRIEF DESCRIPTION OF THE DRAWINGS

The invention as well as a preferred mode of use, further objectives and advantages thereof will be best understood by reference to the following detailed description of illustrative embodiments when read in conjunction with the accompanying drawings, wherein.

DETAILED DESCRIPTION OF THE PREFERRED EMBODIMENTS

<First Embodiment>

Figure 1:
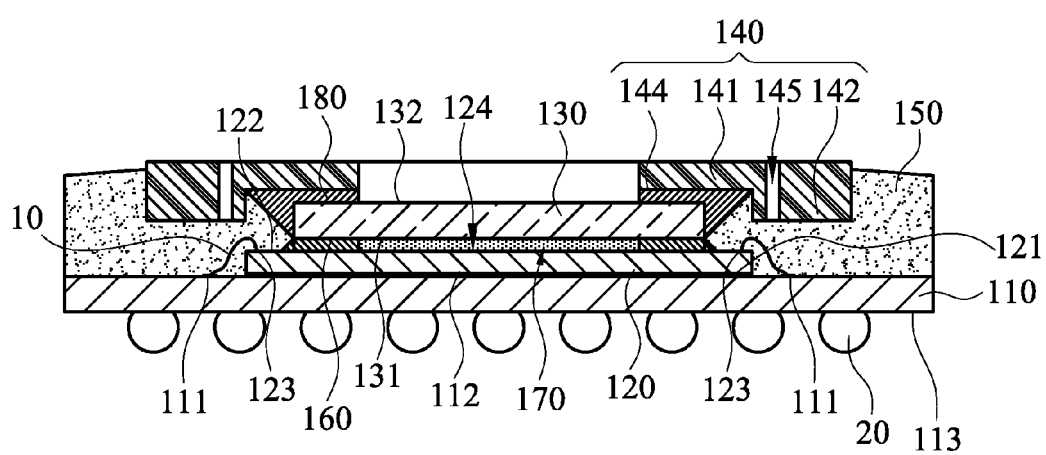
FIG. 1 is a cross-sectional view of an image sensor package structure according to a first embodiment of the present invention.

Referring to FIG. 1, the present embodiment is an image sensor package structure 100, including: a substrate 110, a chip 120, a transparent lid 130, a first casing 140, and a package material 150.

As shown in FIG. 1, the substrate 110 may be a circuit substrate and provided thereon with at least one first conductive contact 111.

The chip 120 has a first surface 121 and a second surface 122, referring to the lower surface and the upper surface of the chip 120, respectively. Therein, the first surface 121 is combined with the substrate 110, so as to adhere the chip 120 to the substrate 110. Additionally, a glue layer 112 may be provided between the chip 120 and the substrate 110 for enhancing the combination between the chip 120 and the substrate 110. The second surface 122 of the chip 120 is formed with at least one second conductive contact 123 and a sensitization area 124. The sensitization area 124 includes therein a plurality of photosensitive elements and one or more said second conductive contacts 123 surrounding the periphery of the sensitization area 124 in electrical connection with the photosensitive elements in the sensitization area 124.

Moreover, the second conductive contact 123 may be electrically connected to the first conductive contact 111 of the substrate 110 through a metal conducting wire 10 formed by wiring. The chip 120 may be a CMOS (Complementary Metal Oxide Semiconductor) image sensor or a CCD (Charge Coupled Device) for sensing light.

As can be seen in FIG. 1, the transparent lid 130 has a third surface 131 and a fourth surface 132, referring to the lower surface and the upper surface of the transparent lid 130, respectively. The transparent lid 130 covers the sensitization area 124 of the chip 120 for protecting the sensitization area 124 of the chip 120 from contaminants that may otherwise adversely affect the imaging quality of the sensed image. Also, the transparent lid 130 allows light to pass therethrough and enter into the sensitization area 124 of the chip 120.

The third surface 131 of the transparent lid 130 adheres to the second surface 122 of the chip 120 by means of a first adhesive layer 160, which may be made of epoxy resin. Since the first adhesive layer 160 is settled between the sensitization area 124 and the second conductive contact 123, the first adhesive layer 160 does not cover the sensitization area 124, and thus the chip 120 is ensured with the optimal light-sensing effect. As a result of the first adhesive layer 160, an air cavity 170 is formed between the transparent lid 130 and the sensitization area 124 of the chip 120.

Figure 2:
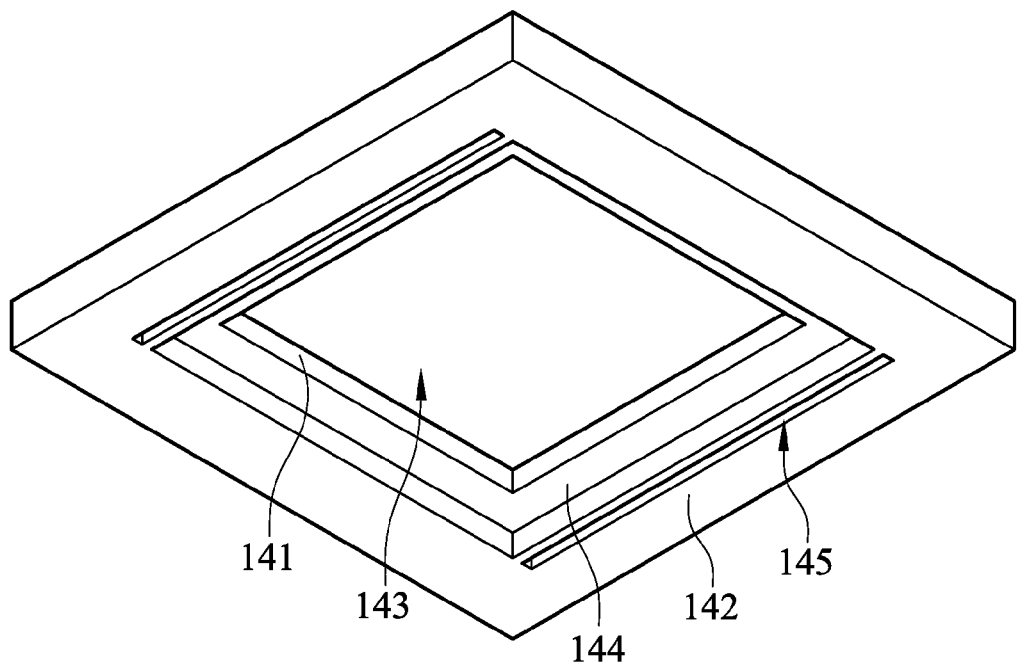
FIG. 2 is a bottom oblique view of a first casing according to the first embodiment of the present invention.

Referring to FIG. 2, the first casing 140 has a first board 141, which may be a quadrilateral board centrally formed with an opening 143. The first casing 140 may further include a flange 142 that is defined by a vertically extended peripheral portion of the first board 141, so that the first casing 140 has a stepped inner periphery.

As shown in FIG. 1, the first board 141 has a fifth surface 144 adhering to the fourth surface 132 of the transparent lid 130 by means of a second adhesive layer 180. In other words, the peripheral surface of the opening 143 of the first board 141 is adhesively attached to the transparent lid 130, while the second adhesive layer 180 extends and covers lateral sides of the transparent lid 130 for enhancing the combination between the first casing 140 and the transparent lid 130. The second adhesive layer 180 may also be made of epoxy resin.

Again in FIG. 1, the opening 143 of the first board 141 is positioned corresponding to the sensitization area 124 of the chip 120, so as to allow light to pass through the opening 143 and pierce through the transparent lid 130 to enter into the sensitization area 124 of the chip 120, thereby enabling the sensitization area 124 to receive light and conduct its sensing function.

The first casing 140 may be made of a heat-resistant plastic material or a metal material. When the first casing 140 is made of the metal material, the first casing 140 provides additional heat-dissipation effect to the image sensor package structure 100. Furthermore, the first casing 140 and the transparent lid 130 may be adhesively combined beforehand by means of the second adhesive layer 180, and then jointly adhered to the chip 120 by means of the first adhesive layer 160.

Also in FIG. 1, the package material 150 is formed by injecting liquid compound or mold compound to cover around the chip 120, the transparent lid 130, and the first casing 140 at peripheries thereof so that the chip 120 and metal conducting wires 10 are protected by the package material 150 from damage that may be otherwise caused by external force or moisture.

For dissipation of volatile gases contained in the liquid compound during compound dispensing, the first casing 140 or the flange 142 of the first casing 140 may further have at least one gas vent 145. The gas vent 145 penetrates through the first casing 140 or the flange 142 so as to allow the volatile gases in the liquid compound to instantly dissipate through the gas vent 145 during compound dispensing or baking. It prevents formation of air bubbles otherwise incurred by such volatile gases in the package material 150, and ensures the production yield of the image sensor package structure 100.

Still referring to FIG. 1, in the image sensor package structure 100, the first adhesive layer 160 and the second adhesive layer 180 adhere the transparent lid 130 to the chip 120 and adhere the first casing 140 to the transparent lid 130, respectively. The fourth surface 132 of the transparent lid 130 is peripherally covered by the second adhesive layer 180 while the first board 141 covers thereon. Consequently, the transparent lid 130 has its edges covered and sealed by the first casing 140 and the second adhesive layer 180, thereby elongating the blockage area from moisture seeping into the air cavity 170 and in turn effectively enhancing the reliability of the image sensor package structure 100.

The first casing 140 in the image sensor package structure 100 not only advantageously provides structural support but also decreases the volume of the package material 150, which reduces the amount of liquid compound used in the image sensor package structure 100, and thereby lowering material costs.

<Second Embodiment>

Figure 3:
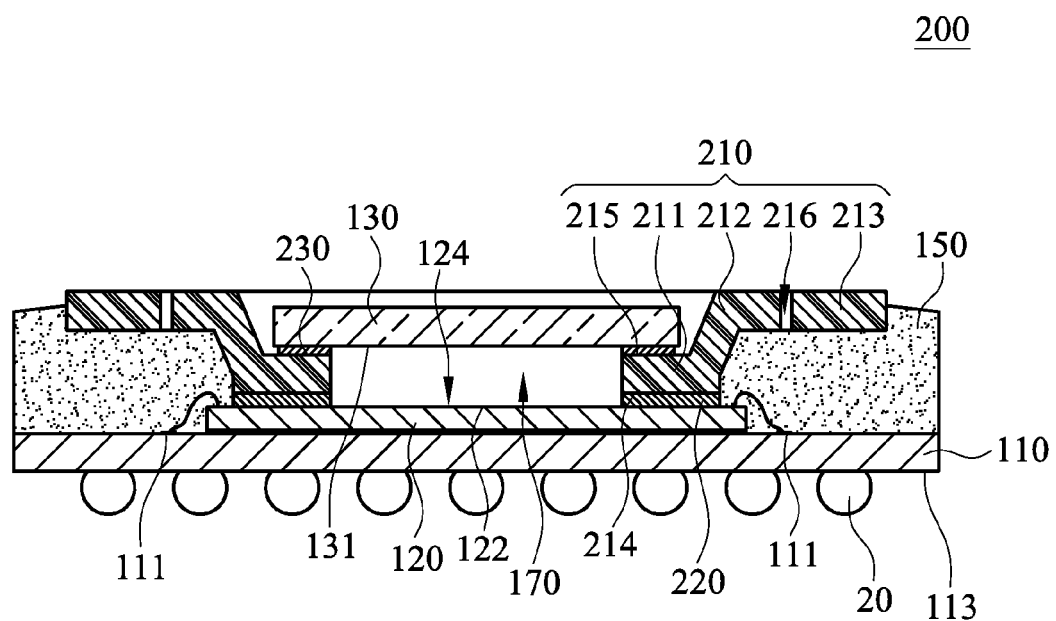
FIG. 3 is a cross-sectional view of an image sensor package structure according to a second embodiment of the present invention.

Referring to FIG. 3, in an image sensor package structure 200 of the present embodiment, the first casing 140 of the first embodiment is replaced by a second casing 210. While the remainder has been described in detailed in the first embodiment, related explanation is omitted herein. The second casing 210 is combined with the transparent lid 130 in a different way. The second casing 210 has a second board 211, a third board 212, and a fourth board 213.

According to FIG. 3, the second board 211 and the fourth board 213 of the second casing 210 are parallel to each other while the third board 212 serves to connect edges of the second board 211 and the fourth board 213, so that the second casing 210 has a stepped shape. Moreover, the third board 212 may be perpendicular to the second board 211 and the fourth board 213, or be connected to either boards (second board 211 and fourth board 213) at angles other than 90 degrees. The second board 211 has a sixth surface 214 adhering to the second surface 122 of the chip 120 by means of a third adhesive layer 220, so as to adhere the second casing 210 to the chip 120.

The second board 211 further has a seventh surface 215 adhering to the third surface 131 of the transparent lid 130 by means of a fourth adhesive layer 230. Both the third adhesive layer 220 and the fourth adhesive layer 230 may be made of epoxy resin. The transparent lid 130 and the second board 211 may be formed through an injection molding process as a whole before the second casing 210 is adhered to the chip 120 by means of the third adhesive layer 220.

Also in FIG. 3, the fourth board 213 of the second casing 210 may further have at least one gas vent 216. The gas vent 216 penetrates through the second casing 210 so as to allow the volatile gases in the liquid compound to instantly dissipate through the gas vent 216 during compound dispensing or baking. It prevents formation of air bubbles otherwise incurred by volatile gases in the package material 150 and ensures the production yield of the image sensor package structure 200. The package material 150 is arranged between the substrate 110 and the second casing 210 for covering the periphery of the second casing 210, the metal conducting wires 10 and the chip 120. In addition, since the second casing 210 directly adheres to the chip 120, it may be made of a heat-resistant plastic material, enduring a temperature as high as 260 or more.

In the image sensor package structure 200, since the chip 120 and transparent lid 130 jointly sandwich therebetween the third adhesive layer 220, the second board 211 and the fourth adhesive layer 230, a distance between the transparent lid 130 and the chip 120 is enlarged, in turn widening the air cavity 170 in volume, preventing ghost images that are otherwise caused by multiple reflection or diffraction of light, thereby improving the imaging quality of the image sensor.

In addition, the second casing 210 in the image sensor package structure 200 not only advantageously provides structural support but also reduces the volume of the package material 150, which also decreases the amount of liquid compound used in the image sensor package structure 200, thereby lowering material costs.

<Third Embodiment>

Figure 4:
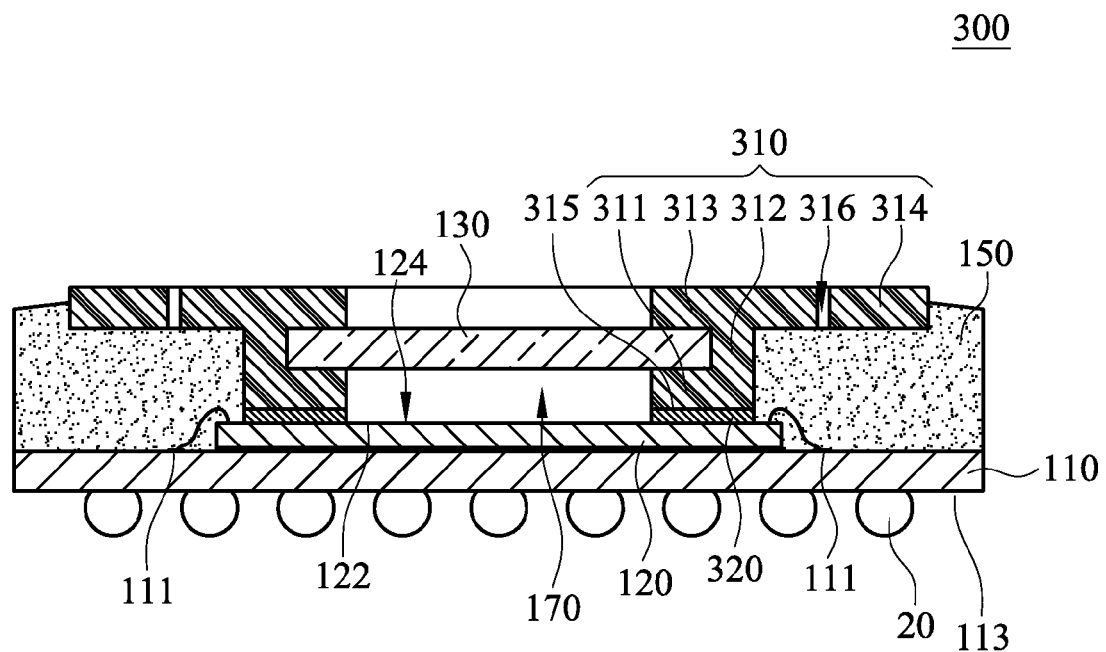
FIG. 4 is a cross-sectional view of an image sensor package structure according to a third embodiment of the present invention.

Referring to FIG. 4, in an image sensor package structure 300 of the present embodiment, the second casing 210 of the second embodiment is replaced by a third casing 310. Since the remainder has been described in detailed in the first embodiment, related explanation is omitted herein. The third casing 310 has a fifth board 311, a sixth board 312, a seventh board 313, and an eighth board 314.

According to FIG. 4, the fifth board 311 and the seventh board 313 are parallel to each other while the sixth board 312 serves to connectedges of the fifth board 311 and the seventh board 313, so that the fifth board 311, the sixth board 312, and the seventh board 313 jointly form a transverse U-shaped structure. In addition, the eighth board 314 is defined by an extended peripheral portion of the seventh board 313 extending transversely outward from the third casing 310.

As can be seen in FIG. 4, the fifth board 311 has an eighth surface 315 adhering to the second surface 122 of the chip 120 by means of a fifth adhesive layer 320, so as to fixedly fasten the third casing 310 to the chip 120. The opening defined by the transverse U-shaped structure of the third casing 310 locking in the transparent lid 130 so that the periphery of the transparent lid 130 is fully covered by the third casing 310. Similarly, the transparent lid 130 and the third casing 310 may be formed through an injection molding process as a whole before adhering to the chip 120 by means of the fifth adhesive layer 320.

Also in FIG. 4, the eighth board 314 may further have at least one gas vent 316. The gas vent 316 penetrates through the eighth board 314 so as to allow the volatile gases in the liquid compound to instantly dissipate through the gas vent 316 during compound dispensing or baking, in turn preventing formation of air bubbles otherwise incurred by such volatile gases in the package material 150, and ensuring the production yield of the image sensor package structure 300. The package material 150 is arranged between the substrate 110 and the third casing 310 for covering the periphery of the third casing 310, the metal conducting wires 10 and the chip 120. In addition, since the third casing 310 directly adheres to the chip 120, it may be made of a heat-resistant plastic material, enduring a temperature as high as 260 or more.

In the image sensor package structure 300, since the chip 120 and transparent lid 130 jointly sandwich between them the fifth board 311 and the fifth adhesive layer 320, the distance between the transparent lid 130 and the chip 120 is enlarged, in turn increasing the air cavity 170 in volume, thereby improving the imaging quality of the image sensor. In addition, the third casing 310 in the image sensor package structure 300 not only advantageously provides structural support but also reduces the volume of the package material 150, which also decreases the amount of liquid compound used in the image sensor package structure 300, thereby reducing material costs.

In the image sensor package structures 100, 200, 300, the presence of the gas vents 145, 216, 316 effectively ensures dissipation of volatile gases during the compound dispensing or baking process. Furthermore, in the image sensor package structure 100 or 300, the transparent lid 130 is peripherally covered by the second adhesive layer 180 or the seventh board 313, which elongating the blockage area of moisture entering into the air cavity 170 and thus preventing moisture invasion that may otherwise occur in the air cavity 170.

In each of the above embodiments, a plurality of solder balls 20 may be attached to the lower surface 113 of the substrate 110. The solder balls 20 may be electrically connected to the first conductive contacts 111 on the substrate 110 by means of the circuit structure of the substrate 110 so that the solder balls 20 allow the image sensor package structure 100, 200 or 300 to electrically connect with external circuit devices.

Figure 5:
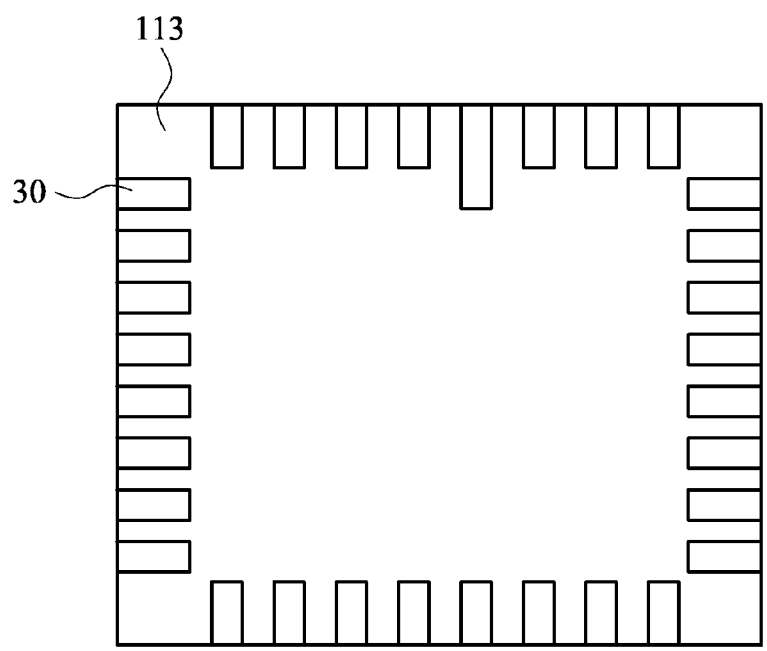
FIG. 5, according to a first concept of the present invention, shows soldering pads formed on the lower surface of the substrate.
Figure 6:
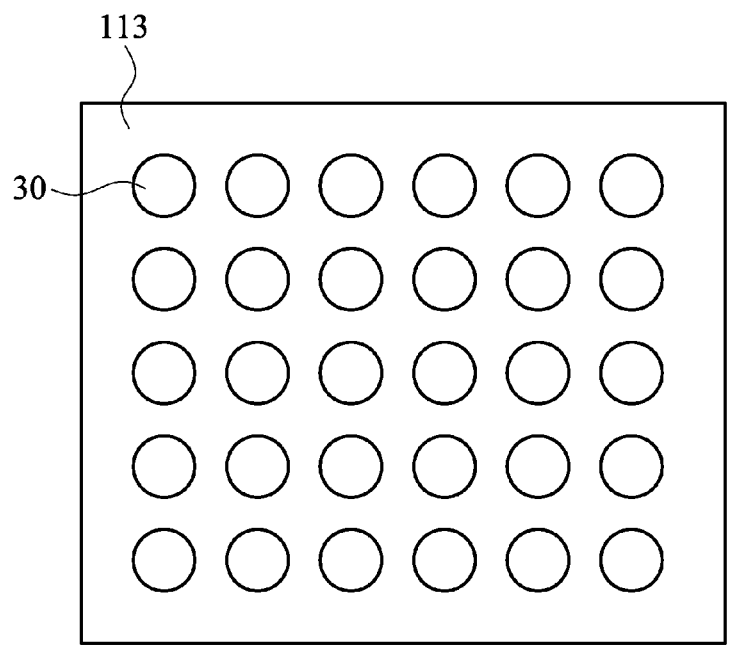
FIG. 6, according to a second concept of the present invention, shows soldering pads formed on the lower surface of the substrate.

Furthermore, referring to FIGS. 5 and 6, in addition to the solder balls 20, soldering pads 30 may be formed on the lower surface 113 of the substrate 110. The soldering pads 30 may also be electrically connected to the circuit structure of the substrate 110, and also be in electrical connection to the first conductive contacts 111 on the substrate 110. Thus, the soldering pads 30 allow the image sensor package structure 100, 200 or 300 to electrically connect with external circuit devices. Preferably, the soldering pads 30 may be formed along the periphery of the lower surface 113, as shown in FIG. 5, or may be formed into an array, as shown in FIG. 6.

The embodiments described above are intended only to demonstrate the technical concept and features of the present invention so as to enable a person skilled in the art to understand and implement the contents disclosed herein. It is understood that the disclosed embodiments are not to limit the scope of the present invention. Therefore, all equivalent changes or modifications based on the concept of the present invention should be encompassed by the appended claims.

What is claimed is:

1. An image sensor package structure with casing, comprising:
   a substrate provided with a plurality of first conductive contacts;
   a chip including a first surface and a second surface opposite to the first surface, wherein the first surface is bound to the substrate while the second surface has a sensitization area and a plurality of second conductive contacts that surrounds a periphery of the sensitization area and is electrically connected with the first conductive contacts;
   a transparent lid having a third surface and a fourth surface opposite to the third surface, wherein the third surface covers over the sensitization area to define an air cavity over the sensitization area;
   a casing having a first board that is adhesively sandwiched between the second surface and the third surface, a second board that has one edge connected with one edge of the first board at an included angle other than 90 degrees, and a third board that is parallel to the first board and second surface and connected with an opposite edge of the second board at an included angle other than 90 degrees; and
   a package material covering around the chip and the casing at peripheries thereof, wherein a first adhesive layer is formed only between an outer peripheral portion of the third surface of the transparent lid and top surface of the first board, and the third board has at least one gas vent that penetrates through the third board in a direction perpendicular to the substrate and the gas vent is without sealing and in communication with the package material, so as to let volatile gases in the package material dissipate through the gas vent.

2. The image sensor package structure of claim 1, wherein the substrate is a circuit substrate.

3. The image sensor package structure of claim 1, wherein the sensitization area has a plurality of photosensitive elements.

4. The image sensor package structure of claim 1, wherein the chip is a CMOS (Complementary Metal Oxide Semiconductor) image sensor.

5. The image sensor package structure of claim 1, wherein the first board has a fifth surface adhering to the second surface through a second adhesive layer.

6. The image sensor package structure of claim 1, wherein the casing is made of a heat-resistant plastic material.

7. The image sensor package structure of claim 1, further comprising a plurality of solder balls or a plurality of soldering pads formed on a lower surface of the substrate.

* * * * *